United States Patent
Koskinen et al.

(10) Patent No.: US 12,356,744 B2
(45) Date of Patent: Jul. 8, 2025

(54) COLOR FILTER ARRAY APPARATUS

(71) Applicant: Huawei Technologies Co., Ltd., Shenzhen (CN)

(72) Inventors: Samu Koskinen, Tampere (FI); Mikko Muukki, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 312 days.

(21) Appl. No.: 17/543,375

(22) Filed: Dec. 6, 2021

(65) Prior Publication Data
US 2022/0093666 A1 Mar. 24, 2022

Related U.S. Application Data

(63) Continuation of application No. PCT/EP2020/065847, filed on Jun. 8, 2020.

(51) Int. Cl.
*H10F 39/00* (2025.01)
*H04N 25/11* (2023.01)
(Continued)

(52) U.S. Cl.
CPC ......... *H10F 39/8053* (2025.01); *H04N 25/11* (2023.01); *H04N 25/13* (2023.01); *H04N 25/133* (2023.01); *H04N 25/134* (2023.01); *H04N 25/135* (2023.01); *H04N 25/136* (2023.01); *H04N 25/46* (2023.01); *H10F 39/806* (2025.01)

(58) Field of Classification Search
CPC ...... H04N 25/11; H04N 25/13; H04N 25/133; H04N 25/134; H04N 25/135; H01L 27/14621; H01L 27/14625
See application file for complete search history.

(56) References Cited

U.S. PATENT DOCUMENTS 3,971,065 A 7/1976 Bayer
4,437,112 A 3/1984 Tanaka et al.
(Continued)

FOREIGN PATENT DOCUMENTS

EP 0119862 A2 9/1984
EP 2822036 A2 1/2015
(Continued)

OTHER PUBLICATIONS

"RGB, Primary color filters for image sensor (IS) applications," https://www.fujifilm.com/us/en/business/semiconductor-materials/image-sensor-color-mosaic/rgb#applications, pp. 1-3, USA, Fujifilm Holdings America Corporation (2021).
(Continued)

*Primary Examiner* — Twyler L Haskins
*Assistant Examiner* — Akshay Trehan
(74) *Attorney, Agent, or Firm* — Leydig, Voit & Mayer, Ltd.

(57) ABSTRACT

A color filter apparatus includes a two-dimensional array of an N×M pattern of light sensitive elements with a plurality of I×J pixel groups. A 2×2 pixel group includes a first color filter of a first color that is a primary color and a second color filter of a second color that consists of green content and one other color. When the first color is green, the second color includes another primary color, but not a third primary color. When the first color is not green, the second color includes the first color.

9 Claims, 19 Drawing Sheets

(51) Int. Cl.
*H04N 25/13* (2023.01)
*H04N 25/133* (2023.01)
*H04N 25/46* (2023.01)

(56) References Cited

U.S. PATENT DOCUMENTS

| | | | | |
|---|---|---|---|---|
| 4,939,573 | A * | 7/1990 | Teranishi | H04N 25/135 348/277 |
| 7,057,654 | B2 * | 6/2006 | Roddy | H04N 23/125 348/277 |
| 8,203,633 | B2 | 6/2012 | Adams, Jr. et al. | |
| 10,349,015 | B2 * | 7/2019 | Fossum | H04N 25/135 |
| 2007/0024879 | A1 * | 2/2007 | Hamilton, Jr. | H04N 25/133 358/1.9 |
| 2008/0062290 | A1 * | 3/2008 | Lahav | H10F 39/8053 348/E9.01 |
| 2009/0195681 | A1 * | 8/2009 | Compton | H04N 25/766 348/308 |
| 2012/0019696 | A1 | 1/2012 | Tai et al. | |
| 2015/0002707 | A1 * | 1/2015 | Wu | H04N 23/11 348/279 |
| 2015/0109493 | A1 | 4/2015 | Hayashi et al. | |
| 2015/0109494 | A1 | 4/2015 | Tanaka et al. | |
| 2015/0350575 | A1 | 12/2015 | Agranov et al. | |
| 2018/0227550 | A1 * | 8/2018 | Fossum | H04N 25/133 |
| 2019/0306472 | A1 * | 10/2019 | Buettner | H04N 25/50 |

FOREIGN PATENT DOCUMENTS

| | | |
|---|---|---|
| EP | 3113491 A1 | 1/2017 |
| JP | S59171281 A | 9/1984 |
| JP | 2007208885 A | 8/2007 |
| JP | 2008172580 A | 7/2008 |
| JP | 2015228650 A | 12/2015 |
| KR | 20090033725 A | 4/2009 |
| WO | 2016200430 A1 | 12/2016 |

OTHER PUBLICATIONS

Rehm "Sony IMX586 smartphone sensor comes with 48MP and Quad Bayer design," https://www.dpreview.com/news/0249781150/sony-imx586-smartphone-sensor-comes-with-48mp-and-quad-bayer-design, Total 24 pages (Jul. 23, 2018).

"Color filter array," Wikipedia, https://en.wikipedia.org/wiki/Color_filter_array, Total 8 pages (Jul. 3, 2021).

"Bayer filter," Wikipedia, https://en.wikipedia.org/wiki/Bayer_filter, Total 11 pages (Dec. 9, 2021).

* cited by examiner

COLOR FILTER ARRAY APPARATUS

CROSS-REFERENCE TO RELATED APPLICATIONS

This application is a continuation of International Application No. PCT/EP2020/065847, filed on Jun. 8, 2020, which claims priority to International Application No. PCT/EP2019/064831, filed on Jun. 6, 2019. Both of the aforementioned applications are hereby incorporated by reference in their entireties.

FIELD

Aspects of the present disclosure relate generally to a color filter apparatus and more particularly to a color pattern and arrangement for a color filter array of an image sensor.

BACKGROUND

In digital imaging and photography, a color filter array (CFA), or color filter mosaic (CFM), is a mosaic of tiny color filters placed over the pixel sensors of an image sensor to capture color information. Color filters are needed because the typical photosensors detect light intensity with little or no wavelength specificity, and therefore cannot separate color information.

More common CFA patterns include the Bayer filter pattern and the Quad Bayer filter pattern. The Bayer filter pattern is known for its relatively high sharpness as well as some artifacts depending on the demosaic algorithm. However, the Bayer filter pattern may suffer from visible aliasing due the small repetitive pattern. With the Quad Bayer filter pattern, it can be difficult to design a traditional demosaic algorithm which converts a raw image directly to a Red Green Blue (RGB) image. This is because in full resolution mode, the 2×2 pixel groups of the Quad Bayer filter pattern are far away from a next similar group. This reduces the achievable sharpness and may cause artifacts with small colored objects.

Accordingly, the present inventors have recognized that it would be desirable to be able to provide a color filter apparatus and pattern array that addresses at least some of the problems identified above.

SUMMARY

One or more aspects of the disclosed embodiments are directed to providing a color filter for a color filter apparatus.

According to a first aspect, the present disclosure provides a color filter apparatus that addresses the above-identified problems of the prior art. In one embodiment, the color filter apparatus includes a two-dimensional array of an N×M pattern of light sensitive elements. The N×M pattern includes a plurality of I×J pixel groups, where an I×J pixel group is a 2×2 pixel group. One 2×2 pixel group of the plurality of 2×2 pixel group includes a first color filter of a first color and a second color filter of a second color. The first color is a primary color and the second color consists of green content and one other color. When the first color is green, the one other color is another primary color. When the first color is not green, the one other color is same as the first color. One or more aspects of the disclosed embodiments provide a new color filter array pattern, which can provide high quality in full resolution mode and is also compatible with the Bayer pattern in a binning mode.

In a possible implementation form of the color filter apparatus, two diagonally aligned pixels of the at least one 2×2 pixel group are the primary color and two other diagonally aligned pixels of the at least one 2×2 pixel group are the second color. Sharpness of the color filter apparatus of the disclosed embodiments is improved by proper selection of colors and the arrangement of pixels in the pattern.

In a possible implementation form of the color filter apparatus, non-green primary colors of one of the at least one 2×2 pixel group and non-green primary colors in another one of the at least one 2×2 pixel group are aligned in a same direction, or are aligned perpendicularly to each other. Sharpness of the color filter apparatus of the disclosed embodiments is improved by proper selection of colors and the arrangement of pixels in the pattern.

In a possible implementation form of the color filter apparatus, green primary colors in one of the at least one 2×2 pixel group and green primary colors in another one of the at least one 2×2 pixel group are aligned in a same direction, or are aligned perpendicularly to each other. Sharpness of the color filter apparatus of the disclosed embodiments is improved by proper selection of colors and the arrangement of pixels in the pattern. The particular pattern improves image quality.

In a possible implementation form of the color filter apparatus, non-green primary colors of one of the at least one 2×2 pixel group are aligned perpendicularly to non-green primary colors of another one of the at least one 2×2 pixel group and are aligned in a same direction with green primary colors of a further another one of the at least one 2×2 pixel group. Sharpness of the color filter apparatus of the disclosed embodiments is improved by proper selection of colors and the arrangement of pixels in the pattern. The particular pattern improves image quality.

In a possible implementation form of the color filter apparatus, non-green primary colors of one of the at least one 2×2 pixel group are aligned perpendicularly to non-green primary colors of another one of the at least one 2×2 pixel group and green primary colors of the one of the at least one 2×2 pixel group are aligned perpendicularly to green primary colors of a further one of the at least one 2×2 pixel group. Sharpness of the color filter apparatus of the disclosed embodiments is improved by proper selection of colors and the arrangement of pixels in the pattern. The particular pattern improves image quality.

In a possible implementation form of the color filter apparatus, one pixel of the at least one 2×2 pixel group is a primary color and the other three pixels of the at least one 2×2 pixel group are another color. The color pattern of the disclosed embodiments improves the sharpness and image quality.

In a possible implementation form of the color filter apparatus, a row and a column in the N×M pattern each includes only one primary color. There is at least one row and at least one column between green color pixels in the N×M pattern. A first non-green color pixel is disposed adjacent to and aligned diagonally with a green color pixel and another non-green color pixel is not disposed adjacent to or aligned diagonally with the green color pixel. The color pattern of the disclosed embodiments improves the sharpness and image quality.

In a possible implementation form of the color filter array apparatus the arrangement of two pixels of the first color filter in the at least 2×2 pixel group and the arrangement of the two pixels of the second color filter in the at least 2×2 pixel group are combined into one pixel during binning. Binning different colored first and second pixels of a 2×2 pixel group is unlike other binning approaches such as binning with Bayer and Quad Bayer patterns. In such prior art binning, pixels with same color are combined. Such pixels are from as close distance as possible. In Bayer pattern binning, pixels are not binned inside the 2×2 pixel group. Rather, binning is among same colors in adjacent 2×2 pixel groups. With Quad Bayer pattern binning, the binning is among the same colors in a 2×2 pixel group. By binning different colored first and second pixels inside a 2×2 pixel group as disclosed herein, sensitivity of the color filter apparatus is improved over binning techniques that rely on same color binning.

In a possible implementation form of the color filter apparatus, four pixels of a 2×2 pixel group are combined into one pixel during binning. Binning different colored first and second color pixels of a 2×2 pixel group into one pixel is unlike other binning approaches with the Bayer and Quad Bayer pattern, where pixels with the same color are combined. Such pixels are from as close a distance as possible. In Bayer pattern binning, pixels are not binned inside the 2×2 pixel group. Rather, binning is among same colors in adjacent 2×2 pixel groups. With the Quad Bayer pattern, binning is among the same colors in a 2×2 pixel group. By binning different colored first and second color pixels inside a 2×2 pixel group as disclosed herein, sensitivity of the color filter apparatus is improved over binning techniques that rely on same color binning.

In a possible implementation form of the color filter array apparatus the first color filter is a primary color filter and an arrangement of two pixels of the first color filter in the 2×2 pixel group are combined into one pixel during binning. By binning pixels inside a 2×2 pixel group as disclosed herein, sensitivity of the color filter apparatus is improved while maintaining color of the first color filter.

In a possible implementation form of the color filter apparatus, the first color is green and the second color is yellow; or the first color is green and the second color is cyan; or the first color is red and the second color is yellow; or the first color is blue and the second color is cyan. The color patterns of the disclosed embodiments improve the sharpness and image quality of the color filter apparatus.

In a possible implementation form of the color filter apparatus I and J are identical and equal to two. The pattern of the disclosed embodiments improves the sharpness and image quality.

In a possible implementation form of the color filter apparatus, N and M are identical and equal to four. The pattern of the disclosed embodiments improves the sharpness and image quality.

According to a second aspect, the above and further objectives and advantages are obtained by a color filter apparatus. In one embodiment, the color filter apparatus includes a two-dimensional array of an N×M pattern of light sensitive elements. Each N×M pattern has a plurality of I×J pixel groups, where an I×J pixel group is a 2×2 pixel group to form a plurality of 2×2 pixel groups. At least one 2×2 pixel group includes at least one pixel of a first color aligned on a first diagonal (D1) of the at least one 2×2 pixel group and at least one pixel of a second color being aligned on a second diagonal (D2) of the at least one 2×2 pixel group. The first color is a primary color and the second color is a non-primary color. The second diagonal (D2) is perpendicular to the first diagonal (D1). An arrangement of the at least one pixel of the first color in one 2×2 pixel group is disposed parallel to an arrangement of at least one pixel of a first color in another 2×2 pixel group. The color pattern of the color filter apparatus of the disclosed embodiments improves the sharpness and image quality.

In a possible implementation form of the color filter apparatus according to the second aspect, at least one pixel of the second color comprises two pixels of one 2×2 pixel group that are aligned on the second diagonal (D2) with two pixels of at least one other second color of another 2×2 pixel group. Sensitivity and sharpness is improved by proper selection of colors and the arrangement of the pixels in the pattern.

In a possible implementation form of the color filter apparatus according to the second aspect, two pixels of at least one further second color of a 2×2 pixel group are aligned perpendicularly to the second diagonal (D2). Sensitivity and sharpness is improved by proper selection of colors and the arrangement of the pixels in the pattern.

In a possible implementation form of the color filter apparatus according to the second aspect, a plurality of 2×2 pixel groups includes at least one 2×2 pixel group with a non-green first color and at least one 2×2 pixel group with a green first color. Non-green pixels of the at least one 2×2 pixel group with the non-green first color are aligned in parallel to non-green pixels of another one of the at least one 2×2 pixel group with the non-green first color. Green pixels of one of the at least one 2×2 pixel group with the green first color are aligned in parallel to green pixels of another one of the at least one 2×2 pixel group with the green first color. Sensitivity and sharpness is improved by proper selection of colors and the arrangement of the pixels in the pattern.

In a possible implementation form of the color filter apparatus according to the second aspect, an arrangement of the plurality of 2×2 pixel groups includes two first color pixels of a 2×2 pixel group of which the first color is green being aligned in parallel to two first color pixels of an another 2×2 pixel group of which the first color is green and two first color pixels of a 2×2 pixel group of which the first color is red being aligned in parallel to two pixels of a first color of a 2×2 pixel group of which the first color is blue. Sensitivity and sharpness is improved by proper selection of colors and the arrangement of the pixels in the pattern.

In a possible implementation form of the color filter apparatus according to the second aspect, the plurality of the 2×2 pixel groups include at least one 2×2 pixel group with a non-green first color and at least one 2×2 pixel group with a green first color. The non-green pixels of one of the at least one 2×2 pixel group with the non-green first color are aligned perpendicularly to non-green pixels of another one of the at least one 2×2 pixel group with the non-green first color. Green pixels of one of the at least one 2×2 pixel group with the green first color are aligned in parallel to green pixels of another one of the at least one 2×2 pixel group with the green first color. Sensitivity and sharpness is improved by proper selection of colors and the arrangement of the pixels in the pattern.

In a possible implementation form of the color filter apparatus according to the second aspect, an arrangement of the plurality of 2×2 pixel groups includes two first color pixels of a 2×2 pixel group of which the first color is green being aligned in parallel to two first color pixels of another 2×2 pixel group of which the first color is green; and two first color pixels of a 2×2 pixel group of which the first color is red being aligned perpendicularly to two pixels of a first color of the 2×2 pixel group of which the first color is blue. Sensitivity and sharpness is improved by proper selection of colors and the arrangement of the pixels in the pattern.

In a possible implementation form of the color filter apparatus according to the second aspect, the first color is a primary color such as red, blue or green and the second color is a secondary color such as yellow or cyan. Sensitivity and sharpness is improved by proper selection of colors and the arrangement of the pixels in the pattern.

In a possible implementation form of the color filter apparatus according to the second aspect, I and J are identical and equal to two. The pattern of the disclosed embodiments improves the sharpness and image quality.

In a possible implementation form of the color filter apparatus according to the second aspect N and M are identical and equal to four. The pattern of the disclosed embodiments improves the sharpness and image quality.

In a possible implementation form of the color filter array apparatus according to the second aspect, the arrangement of two pixels of the first color filter in the at least 2×2 pixel group and the arrangement of the two pixels of the second color filter in the at least 2×2 pixel group are combined into one pixel during binning. Binning different colored first and second pixels of a 2×2 pixel group is unlike other binning approaches such binning with Bayer and Quad Bayer patterns. In such prior art binning, pixels with the same color are combined. Such pixels are from as close distance as possible. In Bayer pattern binning, pixels are not binned inside the 2×2 pixel group. Rather, binning is among same colors in adjacent 2×2 pixel groups. With Quad Bayer pattern binning, the binning is among the same colors in a 2×2 pixel group. By binning different colored first and second color pixels inside a 2×2 pixel group as disclosed herein, sensitivity of the color filter apparatus is improved over binning techniques that rely on same color binning.

In a possible implementation form of the color filter apparatus according to the second aspect, four pixels of a 2×2 pixel group of the at least one 2×2 pixel group are combined into one pixel during binning. Binning different colored first and second color pixels of a 2×2 pixel group into one pixel is unlike other binning approaches such as with Bayer and Quad Bayer pattern binning. In prior art binning, pixels with the same color are combined. Such pixels are from as close a distance as possible. With Bayer pattern binning, pixels are not binned inside the 2×2 pixel group. Rather, binning is among the same colors in adjacent 2×2 pixel groups. With the Quad Bayer pattern, binning is among the same colors in a 2×2 pixel group. By binning different colored pixels inside a 2×2 pixel group as disclosed herein, sensitivity of the color filter apparatus is improved over binning techniques that rely on same color binning.

In a possible implementation form of the color filter array apparatus according to the second aspect, the first color filter is a primary color filter and the arrangement of two pixels of the first color filter in the 2×2 pixel group are combined into one pixel during binning. By binning pixels inside a 2×2 pixel group as disclosed herein, sensitivity of the color filter apparatus is improved over binning techniques that rely on same color binning.

In a possible implementation form of the color filter apparatus according to the second aspect, the at least one 2×2 pixel group includes one pixel of the first color, the first color being a primary color, and three pixels of the second color, the second color being a non-primary color. The color patterns of the disclosed embodiments improve the sharpness and image quality of the color filter apparatus.

In a possible implementation form of the color filter apparatus according to the second aspect, an arrangement of a 4×4 pixel group of the least one 2×2 pixel group includes one pixel of a primary color in each row of the 4×4 pixel group; and one pixel of a primary color in each column of the 4×4 pixel group. The color patterns of the disclosed embodiments improve the sharpness and image quality of the color filter apparatus.

In a possible implementation form of the color filter apparatus according to the second aspect, pixels of the 4×4 pixel group with green color are separated by at least one row and one column. The color patterns of the disclosed embodiments improve the sharpness and image quality of the color filter apparatus.

In a possible implementation form of the color filter apparatus according to the second aspect, one pixel of a non-green primary color is aligned diagonally adjacent to a pixel of a green primary color. The color patterns of the disclosed embodiments improve the sharpness and image quality of the color filter apparatus.

These and other aspects, implementation forms, and advantages of the exemplary embodiments will become apparent from the embodiments described herein considered in conjunction with the accompanying drawings. It is to be understood, however, that the description and drawings are designed solely for purposes of illustration and not as a definition of the limits of the disclosed invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

In the following detailed portion of the present disclosure, the invention will be explained in more detail with reference to the example embodiments shown in the drawings, in which.

DETAILED DESCRIPTION

Figure 1A:
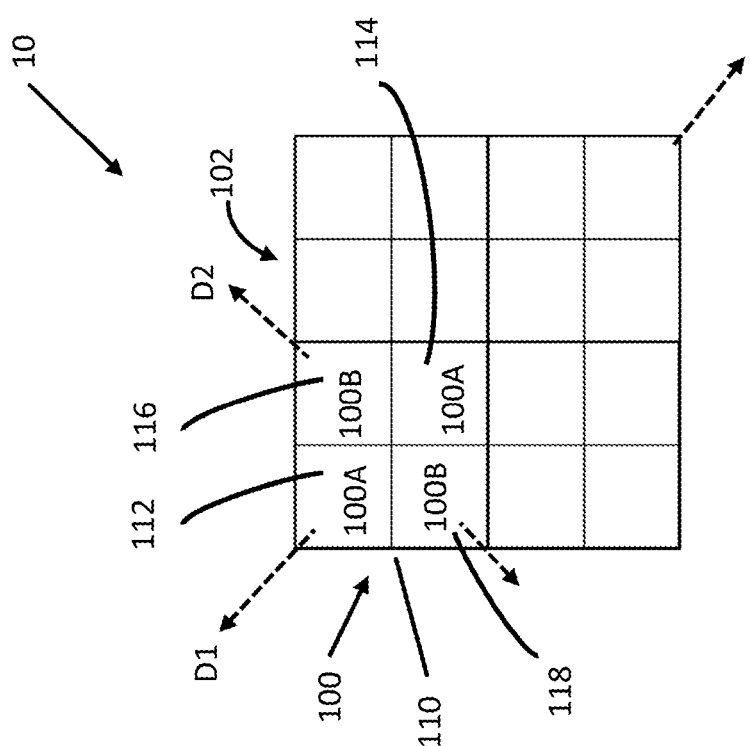
FIGS. 1A and 1B illustrates exemplary arrangements of an N×M pattern for a color filter apparatus incorporating aspects of the disclosed embodiments.

FIG. 1A depicts a color filter apparatus 10, also referred to herein as a color filter array. The color filter array (CFA) may be for an image sensor. A color filter array (CFA) may arrange Red (R), Green (G) and Blue (B) color filters on a square grid of photosensors. As generally described herein, the terms "red", "green" and "blue", as well as other colors or color combinations referred to herein, refer to the corresponding wavelength region. The terms "pixel", "color" or "color filter" as used herein will generally refer to a particular color wavelength region. For example, the terms "red color", "red color filter" or "red pixel" as used herein, are generally intended to refer to the "red" wavelength region.

Referring to FIG. 1A, an exemplary color filter apparatus 10 incorporating aspects of the disclosed embodiments is illustrated. In this example, the color filter apparatus 10 is a two-dimensional array of an N×M pattern 102 of light sensitive elements 104. The N×M pattern 102 will include a plurality of I×J pixel groups 100. In an exemplary embodiment, an I×J pixel group 100 is a 2×2 pixel group and the N×M pattern 102 will include a plurality of 2×2 pixel groups 100.

In one embodiment, an exemplary 2×2 pixel group 100 of the color filter apparatus 10 will include a first color filter 100A of a first color and a second color filter 100B of a second color. In the example of FIG. 1A, the first color filter 100A comprises two pixels 112, 114, of the same color, also referred to as a pair of pixels. The two pixels 112, 114 are aligned on a diagonal and are generally disposed adjacent to one another on the diagonal. The individual pixels 112, 114 will have a color that corresponds to the color of the first color filter 100A.

The second color filter 100B shown in FIG. 1A comprises two pixels 116, 118, of the same color, which can also be referred to as a pair of pixels. The two pixels 116, 118 are aligned on a diagonal and are generally disposed adjacent to one another on the diagonal. The individual pixels 116, 118 will have a color that corresponds to the color of the second color filter 100B.

In the example of FIG. 1A, the first color is a primary color, such as red, blue or green. The second color will consist of only green content and one other color, and will not include a third primary color. When the first color is green, the one other color of the second color is another primary color other than including green. When the first color is not green, the one other color of the second color is the same as the first color, such as red or blue.

For example:

When the first color is green, the second color can be yellow or cyan. Yellow is the combination of green and red and does not include blue. Cyan is the combination of green and blue, and does not include red.

When the first color is blue, the second color can be cyan. Cyan is a combination of green and blue. Cyan does not include red.

When the first color is red the second color can be yellow. Yellow is a combination of green and red. Yellow does not include blue.

Figure 1B:
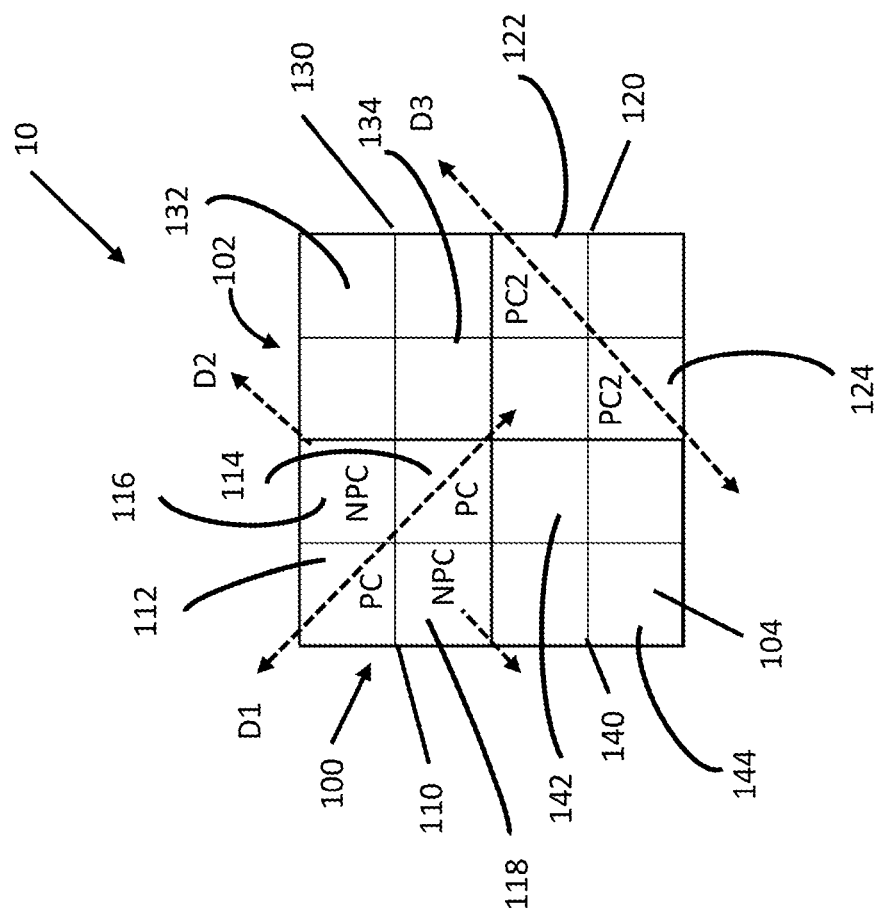

Referring to the example FIG. 1B, four 2×2 pixel groups 100 are illustrated, namely 2×2 pixel group 110, 2×2 pixel group 120, 2×2 pixel group 130 and 2×2 pixel group 140. For the purposes of the description herein, the particular pixel groups will generally be defined by the associated color or color filter. An exemplary 2×2 pixel group will generally be referred to as 2×2 pixel group 100.

As illustrated in FIG. 1B, the at least one 2×2 pixel group 110 includes at least at least one pixel 112 of a first color having a narrow spectrum response, also referred to as a primary color (PC). In one embodiment, the first color having the narrow spectrum response will be red, green or blue. In the example of FIG. 1B, the 2×2 pixel group 110 has two pixels 112, 114 of the first primary color (PC).

As is illustrated in the embodiments of FIGS. 1A and 1B, the two pixels 112, 114 of the first color filter 100A are aligned on a diagonal D1. The two pixels 116, 118 of the second color filter 100B are aligned on diagonal D2. In this manner, the first color of the 2×2 pixel group 100 is aligned on one diagonal while the second color is aligned on another diagonal. In the example of FIG. 1A, the diagonals D1 and D2 are disposed perpendicular to one another. The diagonals D1 and D2 are merely for illustration and only to show the alignment of the pixels relative to one another within the 2×2 pixel group 100.

In one embodiment, the at least one 2×2 pixel group 100 of the N×M pattern 102 will also include at least one pixel of a second color, where the second color has a wide spectrum response. The color filters having the wide spectrum response can be one or more of the non-primary colors (NPC) yellow, cyan or white. In the example of FIG. 1B, there are two pixels 116, 118 shown in the at least one 2×2 pixel group 100 with non-primary colors.

In the example of FIG. 1B, in one embodiment, the two pixels 112, 114, of the primary color PC are disposed perpendicularly to an arrangement of two pixels of primary color PC2. In this example, the pixels PC2 are aligned on a diagonal D3 of the N×M pattern 102. The diagonal D3 is disposed or aligned perpendicular to the diagonal D1, and along the same direction as diagonal D2. The particular positions of diagonals D1, D2 and D3 in FIG. 1 are for illustration only and are not intended to define a specific position or location in the N×M pattern 102.

While the aspects of the disclosed embodiments are described herein and shown in the drawings with reference to specific colors in specific pixel positions in a 2×2 pixel group, the aspects of the disclosed embodiments are not intended to be so limited. Rather, a 2×2 pixel group 100 can be rotated by 90, 180 or 270 degrees, relative to the illustration shown in FIG. 1B in keeping with the aspects of the disclosed embodiments. Examples are shown with respect to FIGS. 2 and 3.

In an embodiment, where the N×M pattern 102 is a 4×4 pattern, the 4×4 pattern will have four 2×2 pixel groups, such as groups 110, 120, 130 and 140 shown in FIG. 1B. The first color having the narrow spectrum will include one red, two greens and one blue, with one color in each of the four 2×2 pixel groups in the N×M pattern 102.

For example, referring to FIG. 1B, pixels 112, 114 of pixel group 110 can comprise a green first color, pixels 132, 134 of pixel group 130 a red first color, pixels 122, 124 of pixel group 120 a green first color, and pixels 142, 144 of pixel group 140 a blue first color. In alternate embodiments, the particular arrangement of first colors can be any suitable first color arrangement, as is generally described herein.

Figure 2:
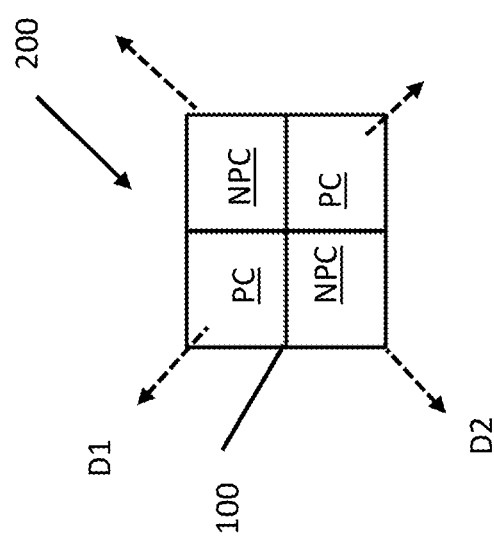

Referring to FIG. 2, in one embodiment, an arrangement 200 of an exemplary 2×2 pixel group 100 includes two colors, a primary color PC and a non-primary color NPC. For example, the primary color PC can comprise for red, while the non-primary color NPC is yellow. Yellow includes green content but does not include blue content, which would be another primary color.

Figure 3:
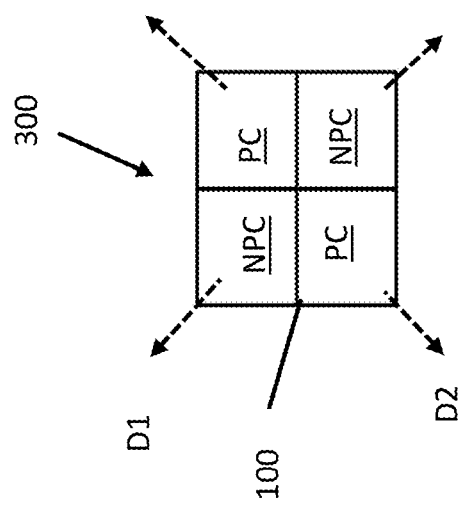
FIGS. 2 and 3 illustrate exemplary arrangement of 2×2 pixel groups for a N×M pattern of a color filter apparatus incorporating aspects of the disclosed embodiments.

FIG. 3 illustrates another embodiment of an arrangement 300 of an exemplary 2×2 pixel group 100 where the primary color pixels PC are arranged in a different order. In this example, the pixel arrangement 300 of the 2×2 pixel group 100 is rotated 90 degrees from the pixel arrangement 200 of the 2×2 pixel group 100 shown in FIG. 2.

Figure 4:
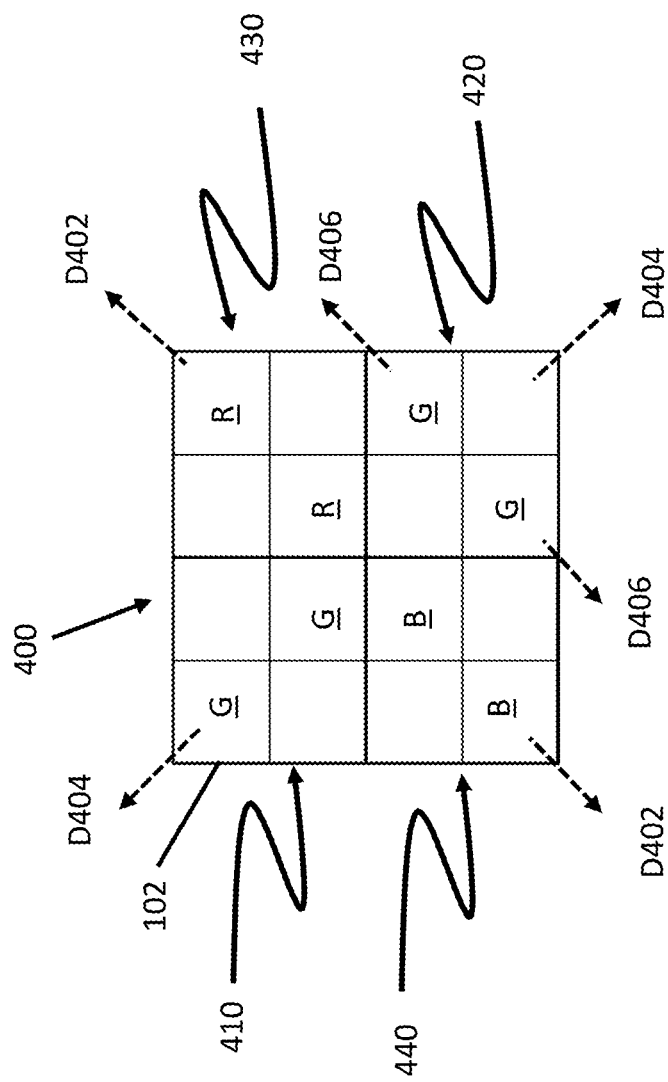
FIG. 4 illustrates an exemplary arrangement of an N×M pattern for a color filter apparatus incorporating aspects of the disclosed embodiments.

In one embodiment, non-green primary colors, such as blue and red, of one 2×2 pixel group 100 can be aligned in a same direction as non-green primary colors in another one of the 2×2 pixel groups 100 in the N×M array 102. FIG. 4 illustrates an exemplary arrangement 400 of pixels in an N×M pattern 102 of a color filter apparatus 10 incorporating aspects of the disclosed embodiments. In this example, the N×M pattern 102 is a 4×4 pattern, and only pixels with one of the primary colors R, G, B are identified. In the 4×4 pattern 102 the arrangement 400 of pixels includes the pixels with a non-green primary color, which in this example are R and B, and which are aligned in a same direction relative to one another. In the example of FIG. 4, the pixels R and B are aligned along the diagonal line D402 in the 4×4 pattern 102.

Figure 5:
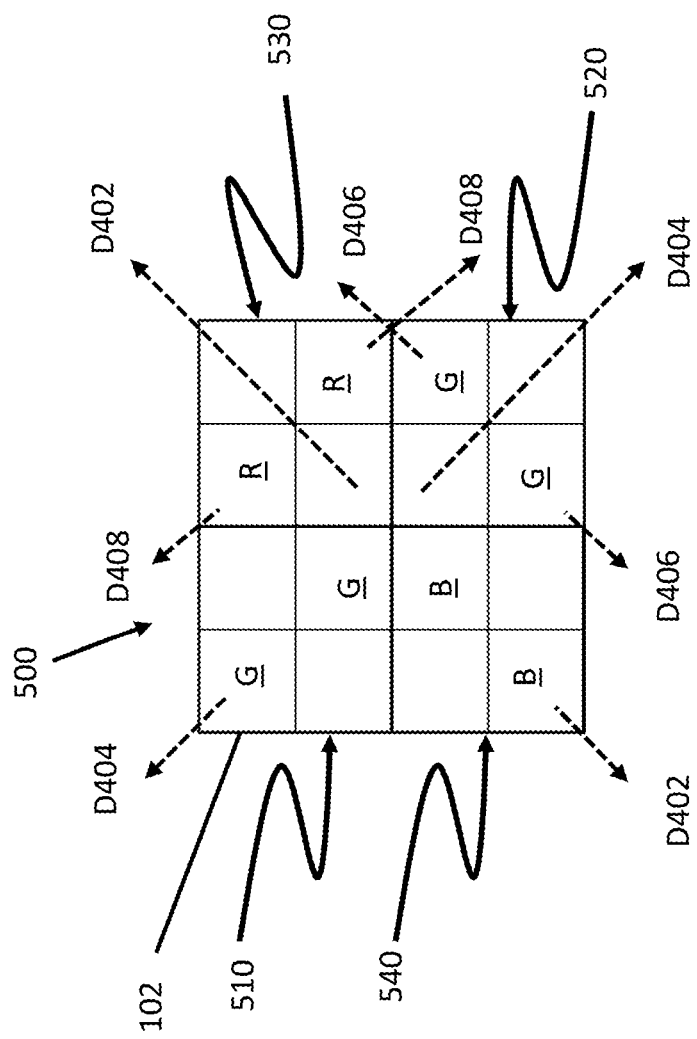
FIG. 5 illustrates an exemplary arrangement of an N×M pattern for a color filter apparatus incorporating aspects of the disclosed embodiments.
Figure 6:
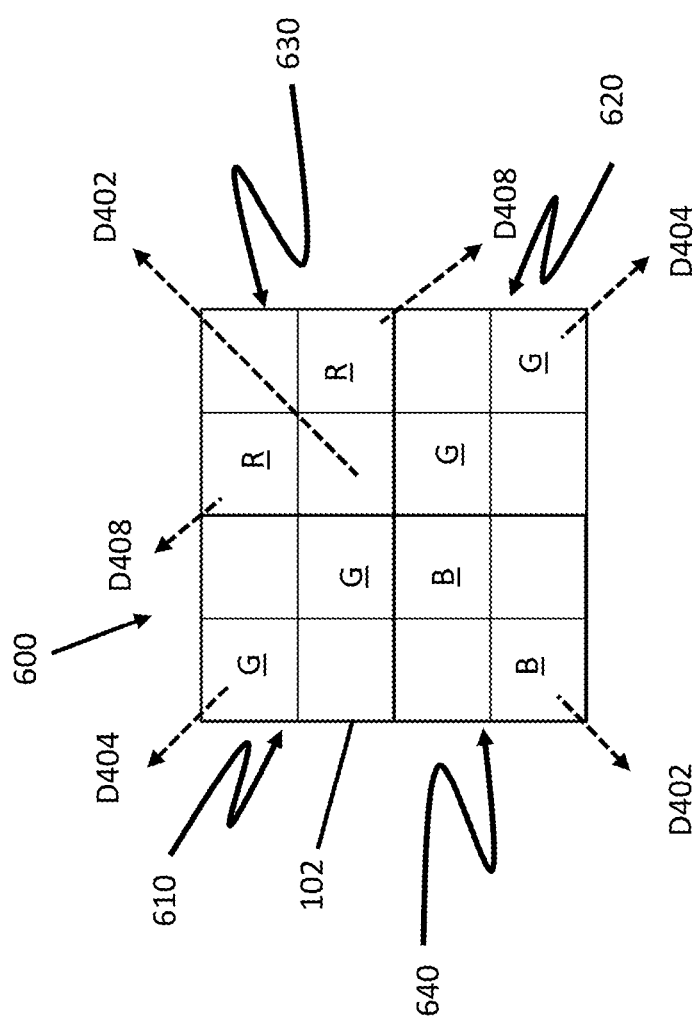
FIG. 6 illustrates an exemplary arrangement of an N×M pattern for a color filter apparatus incorporating aspects of the disclosed embodiments.

The non-green primary colors can also be aligned perpendicular to one another, as is illustrated for example in FIGS. 5 and 6. Referring to FIG. 5, in one embodiment, the direction of the non-green primary colors in arrangement 500 of the N×M pattern 102 are arranged perpendicularly to one another. In this example, the two pixels R of 2×2 pixel group 540 representing the red primary color are arranged or aligned on the diagonal line D408. Diagonal line D408 is arranged substantially perpendicular to the diagonal D402 along which the two pixels B of 2×2 pixel group 530 representing the blue primary color are aligned.

In one embodiment, referring to FIGS. 4 and 6, green primary colors of one 2×2 pixel group 100 are disposed or aligned in a same direction as, or perpendicular to, green primary colors of another one of the 2×2 pixel groups in the N×M array 102. Referring to FIG. 6, in one embodiment of an arrangement 600 of a N×M pattern 102, pixels with the green primary or narrow spectrum color are aligned in a same direction. In this example, the pixels G identify pixels with the green primary color. As shown in FIG. 6, the pixels G in 2×2 pixel group 610 are aligned in the same direction along diagonal line D404 with the pixels G in 2×2 pixel group 620. In this example, the pixels R, representing pixels with the primary color red, in 2×2 pixel group 630, along diagonal D408, are aligned perpendicularly to the pixels B, representing pixels with the primary color blue, with reference to diagonal D402.

As is also shown in FIG. 4, pixels with the green primary color are arranged in the 4×4 pattern 102 perpendicularly relative to one another. In this example, the pixels G in the 2×2 pixel group 420 in the arrangement 400 of the 4×4 pattern 102, representing the primary color green, are aligned on diagonal line D404. The pixels G in the 2×2 pixel group 420 in the 4×4 pattern 102 are aligned on the diagonal line D406. Lines D404 and D406 are substantially perpendicular to one another. Thus, the pixels G of group 410 are aligned perpendicularly relative to pixels G of group 420.

FIGS. 5 and 6 illustrate examples where non-green primary colors of a 2×2 pixel group 100 are aligned perpendicularly to non-green primary colors of another 2×2 pixel group 100 and in the same direction as green primary colors of a further 2×2 pixel group 100. As shown in FIG. 5, in one embodiment, the pixels R and B with the non-green colors in the 2×2 pixel groups 530, 540 of the N×M pattern 102 are aligned in a direction that is perpendicular with respect to one another. The pixels R of the other non-green color in the 2×2 pixel group 530 of the N×M pattern 102 are aligned along a same direction as a direction of pixels G with the green colors in the 2×2 pixel group 510. The pixels B of the other non-green color in the 2×2 pixel group 540 the N×M pattern 102 are aligned along a same direction as a direction of pixels G with the green colors in the 2×2 pixel group 520.

Referring to the arrangement 600 of FIG. 6, the pixel groups with the non-green primary colors includes 2×2 pixel groups 630 and 640. Pixel group 630 includes two red color pixels and pixel group 640 includes two blue color pixels. The two pixels R of 2×2 pixel group 630 are aligned perpendicular to the two pixels B of 2×2 pixel group 640, as illustrated by lines D402 and D408. Further, the pixel groups with green primary colors include pixel groups 610, 620. The two pixels G of 2×2 pixel group 610 are aligned or disposed along the same diagonal line D404 as the two pixels G of the 2×2 pixel group 620.

In the example of FIG. 6, the non-green color pixels of the two groups 630, 640 are aligned perpendicular to one another. The two red color pixels of pixel group 630 are aligned in the same direction as the green color pixels of groups 610 and 620. The two blue color pixels of pixel group 640 are aligned perpendicular to the green color pixels of groups 610 and 620.

As is also illustrated in the example of FIG. 5, in one embodiment, in combination with the other embodiments described herein, pixels of the non-green primary colors in the different 2×2 pixel groups of the arrangement 500 of the N×M pattern 102 are aligned perpendicular relative to one another and the pixels of the green primary colors in the different 2×2 pixel groups are aligned perpendicular to one another. In the example of FIG. 5, 2×2 pixel group 530 has two pixels of a non-green primary color, which in this example is red. The 2×2 pixel group 540 has two pixels of a non-green primary color, which in this example is blue. The pixels R of 2×2 pixel group 530 are aligned perpendicularly to the pixels B of 2×2 pixel group 540.

Further, as noted, the two pixels of the green primary color in 2×2 pixel group 510 are aligned perpendicularly relative to the two pixels G of the 2×2 pixel group 520. This is illustrated in FIG. 5 by the lines D404 and D406.

Figure 7:
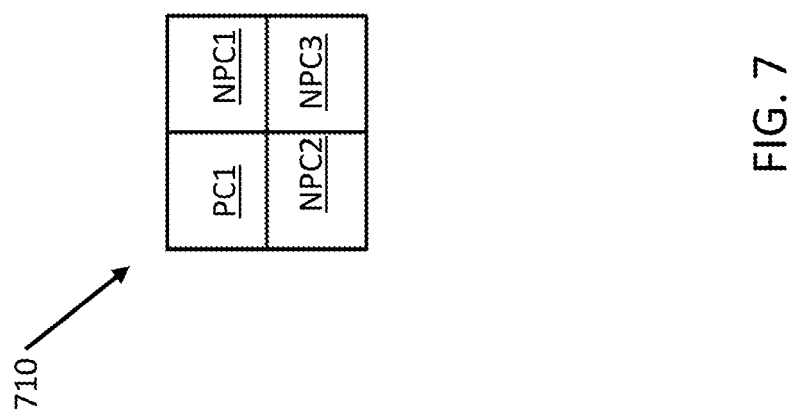
FIG. 7 illustrates an exemplary arrangement of a 2×2 pixel group for a N x M pattern of a color filter apparatus incorporating aspects of the disclosed embodiments.

Referring to FIG. 7, in one embodiment, one pixel of a 2×2 pixel group 100 is a primary color and the other three pixels of the 2×2 pixel group 100 are another color. In the example shown in FIG. 7, there is only one primary color pixel, PC1, in a 2×2 pixel group 710 of the N×M pattern 102. The other three pixels of the 2×2 pixel group 710, shown as NPC1, NPC2, and NPC3 in this example, are a non-primary color. In this example, pixel PC1 is one of the primary colors red, green or blue. Pixels NPC1, NPC2 and NPC3 are a non-primary color.

Figure 8:
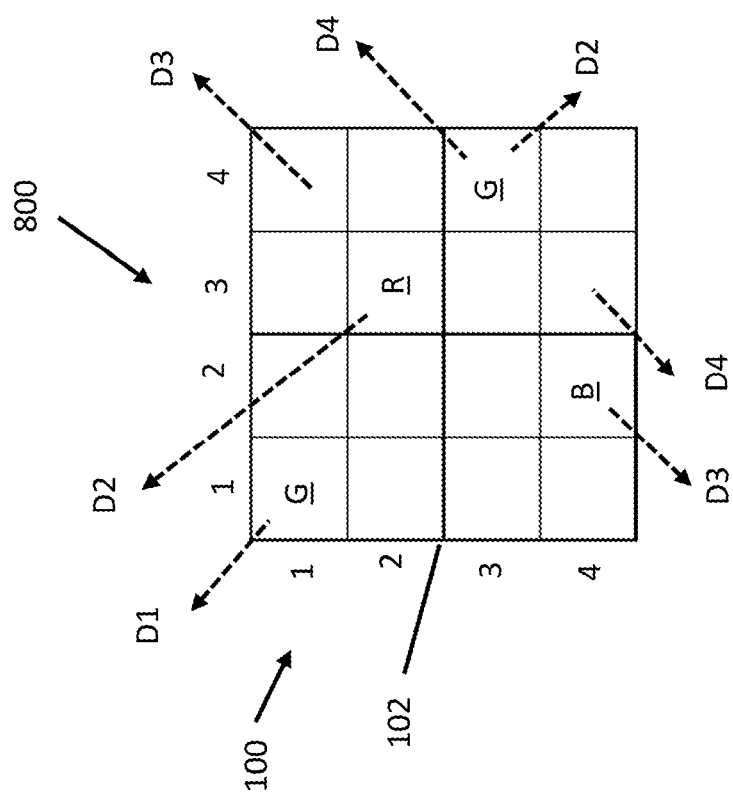
FIG. 8 illustrates an exemplary arrangement of an N×M pattern for a color filter apparatus incorporating aspects of the disclosed embodiments.

Referring also to FIG. 8, in one embodiment of an N×M pattern 102, where N and M are identical and equal to four, the arrangement 800 of pixels in the 4×4 pattern 102 is such that there is only one primary color PC per row N and column M. The green pixels, shown as G in this example, will have at least one row N and one column M in between. The pixel with first non-green color but not the other non-green color, or the pixel with other non-green color but not the first non-green color, shown as R in this example, is aligned diagonally, and connected or adjacent to the green color as shown in FIG. 8.

For example, as shown in FIG. 8, the first row 1 and first column 1 of the 4×4 pattern 802 includes a pixel G with a green primary color. The second row and the third column of the 4×4 pattern 802 includes a pixel R with the red primary color. The third row and the fourth column of the 4×4 pattern 802 has a pixel G with the green primary color. The fourth row and the second column of the 4×4 pattern includes a pixel B with a blue primary color.

As shown in the example of FIG. 8, the first green color in the first pixel G in row 1, column 1, is separated from the second green color, pixel G in row 3, column 4 by at least one row and at least one column. The pixel R with the red color in row 2, column 3 is on the diagonal line D2 and adjacent to or connected with the pixel G with the green color in row 3, column 4.

As illustrated in FIG. 8, the pixel G with the green color in row 1, column 1, is aligned perpendicular to the pixel G with the green color in row 1, column 4, as shown by diagonal lines D1 and D4. The pixel B, with the non-green primary color in row 1, column 4, is aligned in the same direction as the pixel R with the non-green primary color in row 2, column 3 as illustrated by diagonal line D3.

Figure 10:
FIG. 10 illustrates the result of binning the pixels of the exemplary N×M pattern of FIG. 9.
Figure 9:
FIG. 9 illustrates an exemplary arrangement of an N×M pattern for a color filter apparatus incorporating aspects of the disclosed embodiments.
Figure 11:
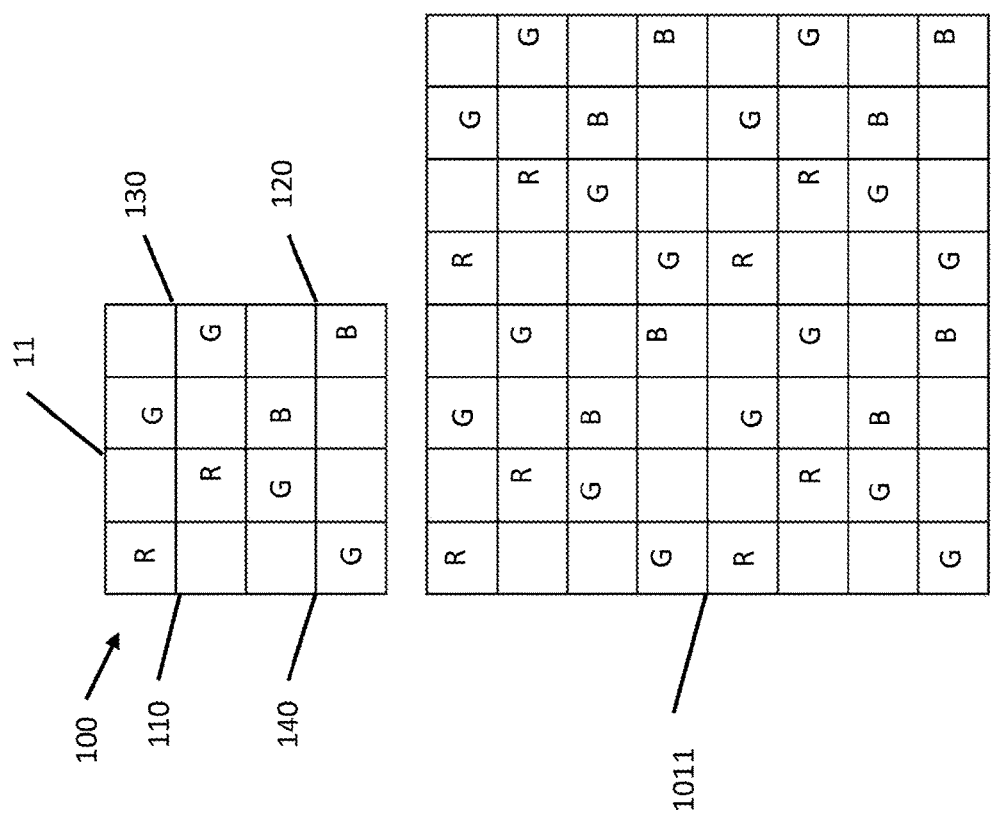
FIGS. 11-20 illustrate exemplary arrangements of patterns for color filter arrays incorporating aspects of the disclosed embodiments.
Figure 12:
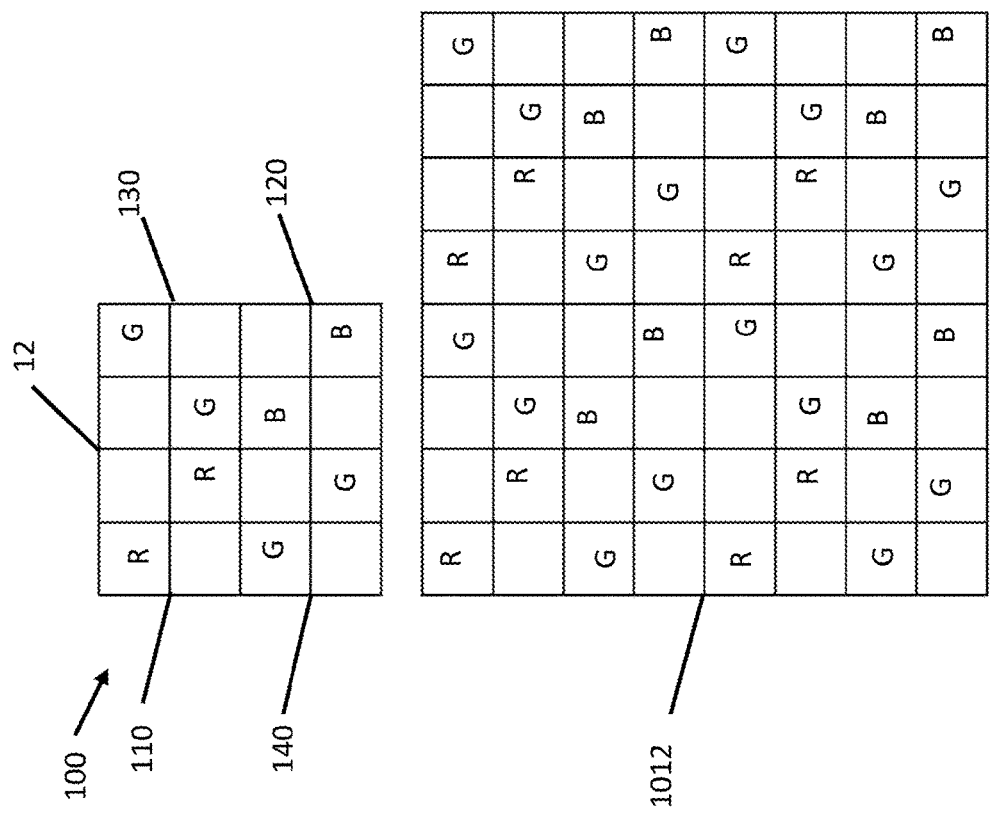
Figure 13:
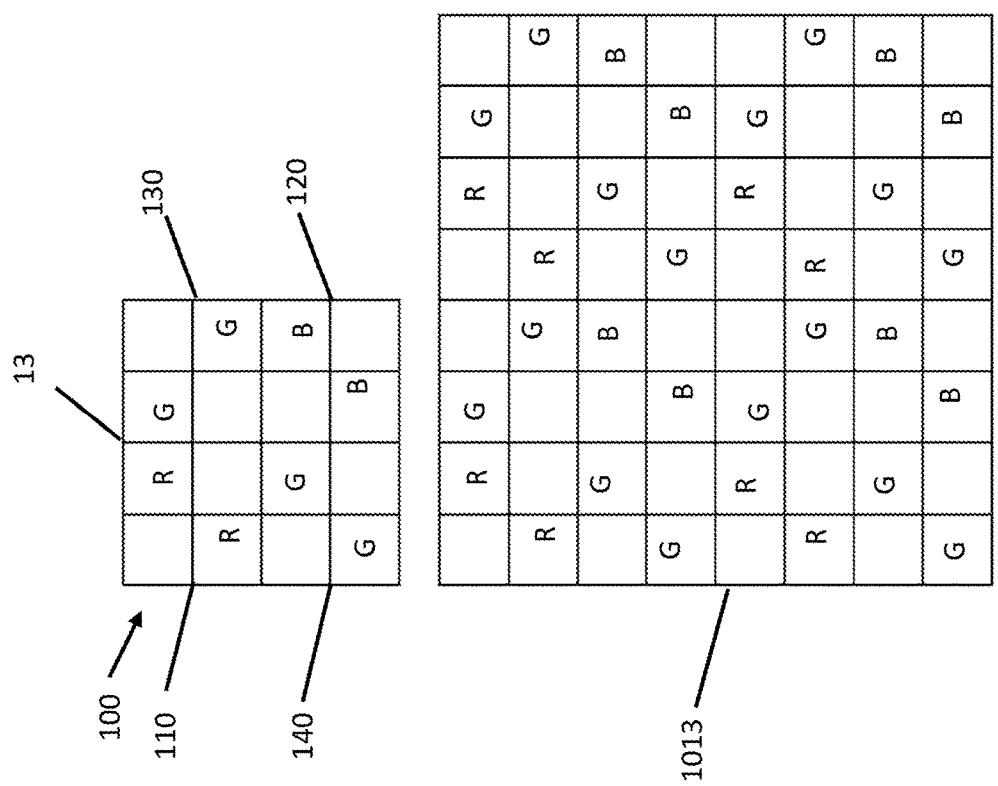
Figure 14:
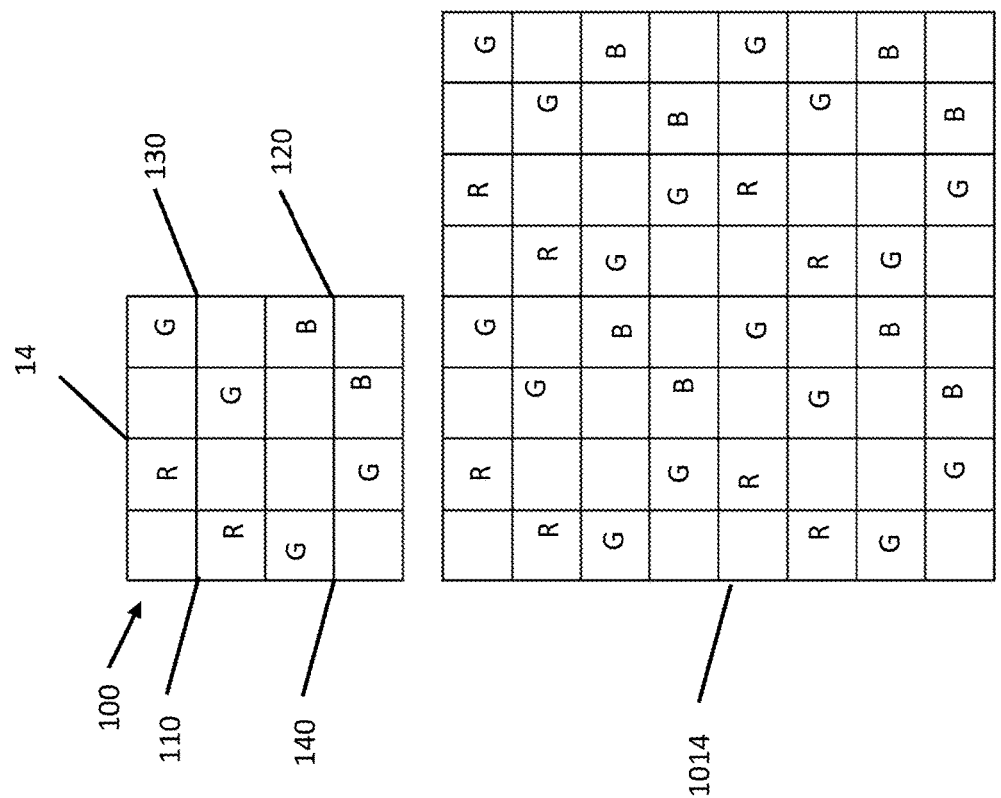
Figure 15:
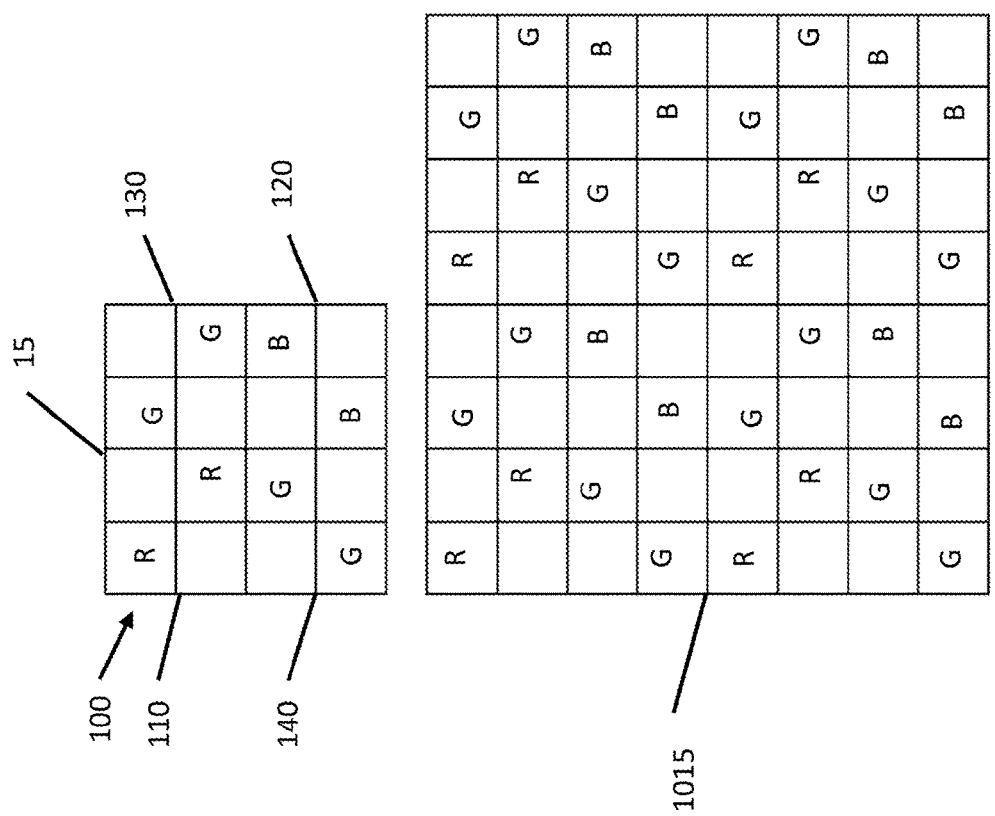
Figure 16:
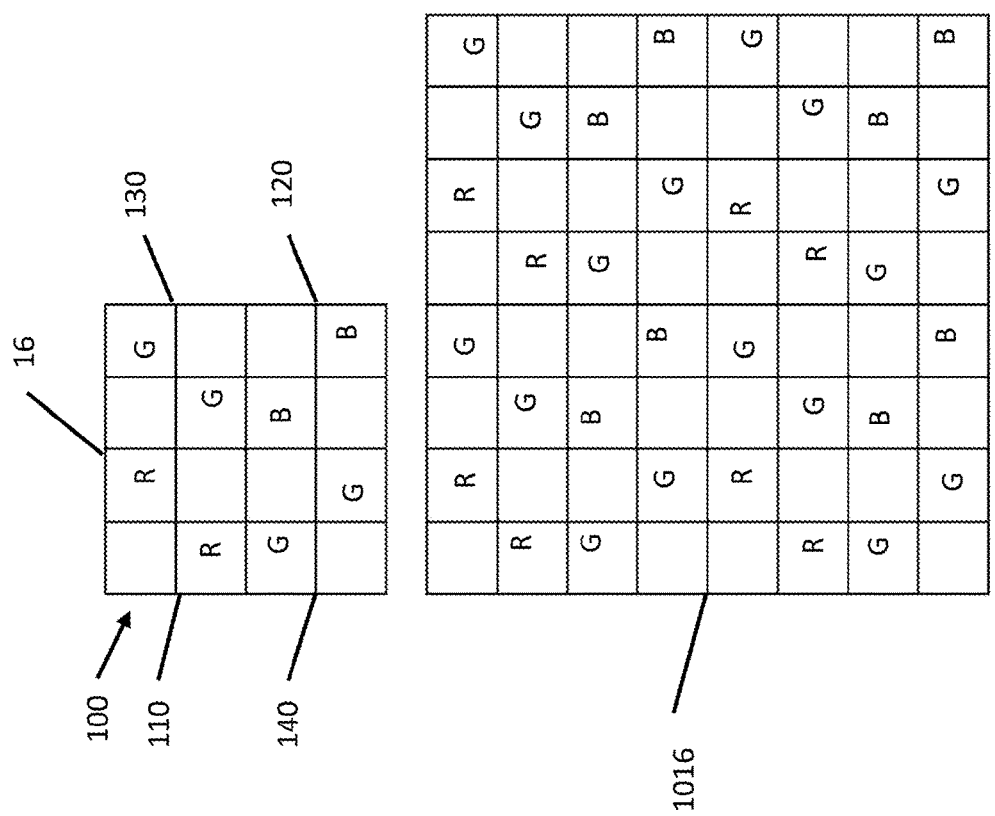
Figure 17:
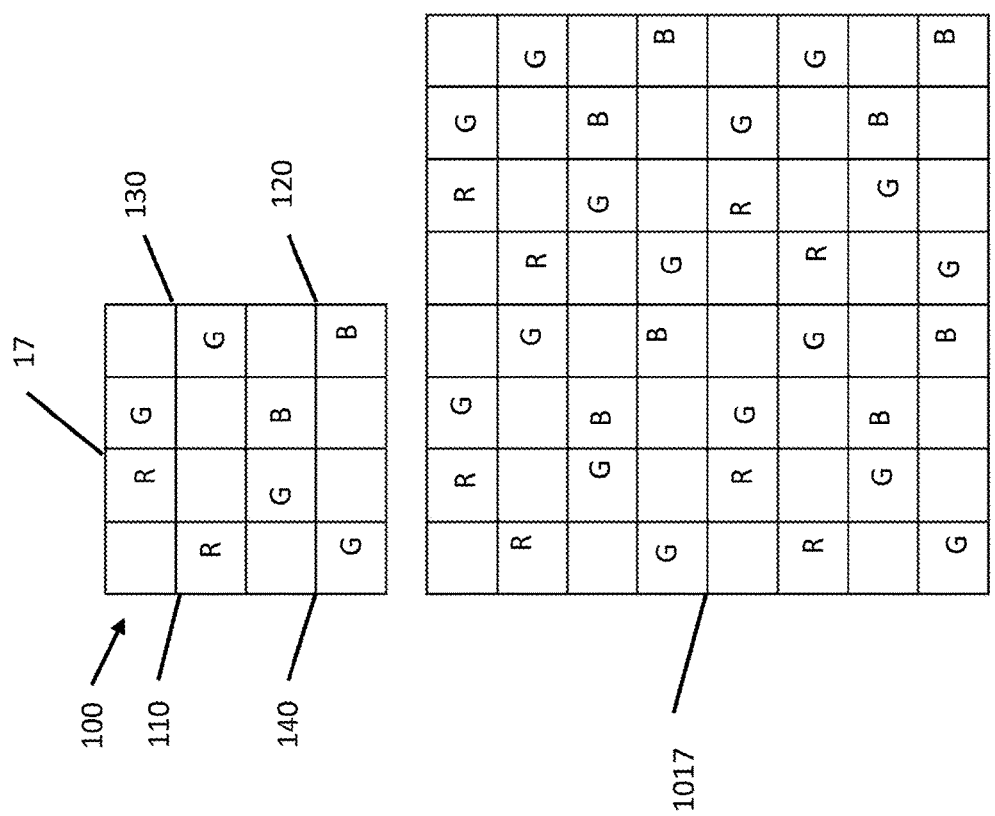
Figure 18:
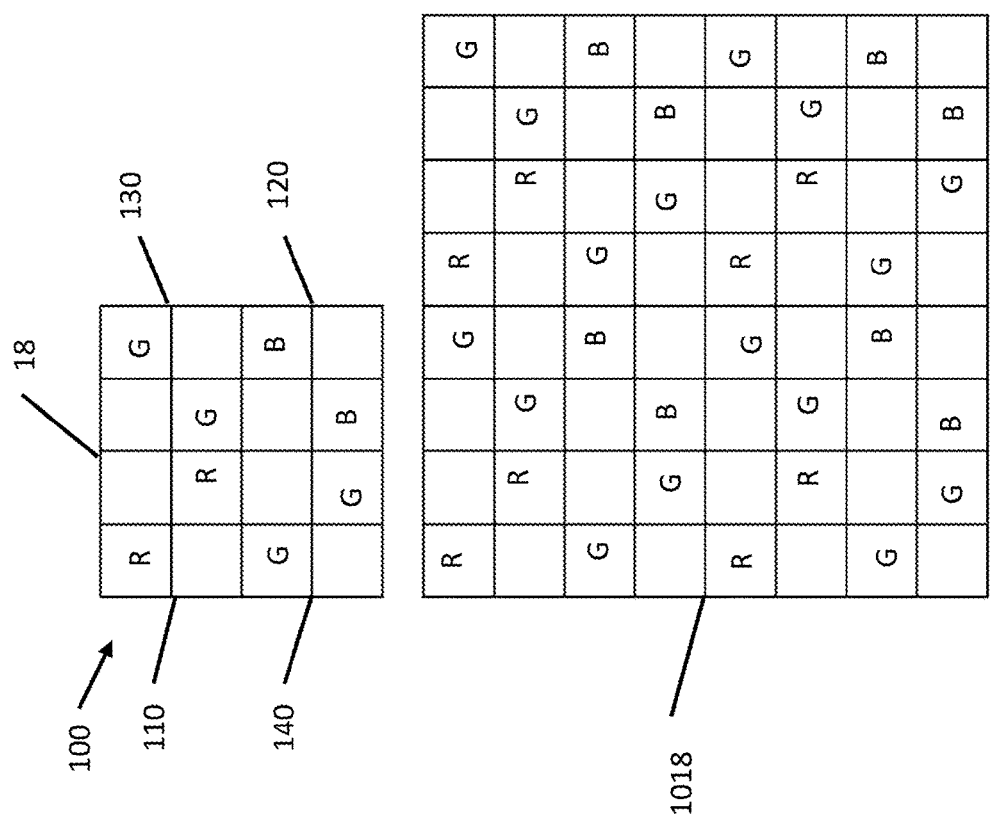

Referring to FIGS. 9-10, examples of binning of the pixels of an N×M pattern 102 incorporating aspects of the disclosed embodiments are illustrated. When binning the pixels of an N×M pattern 102 of the disclosed embodiments, the binning is performed by combining each group of 2×2 pixels into one pixel. The aspects of the disclosed embodiment bin the pixels inside a 2×2 pixel group 100.

In the examples of FIGS. 9 and 10, in one embodiment, the colors of binned pixels are the primary colors red R, green G and blue B. The initial 4×4 pattern 902 is shown in FIG. 9. The binned pattern 904 is shown in FIG. 10. In a first embodiment, when binning each group of pixels of the 4×4 pattern 902 into one pixel, the pixel arrangement of the 2×2 pixel group 904 of FIG. 10 is arranged as follows:

$$1 = 2 \times G + 2 \times Y$$
$$2 = 2 \times R + 2 \times Y$$
$$3 = 2 \times B + 2 \times C$$
$$4 = 2 \times G + 2 \times Y$$

The pixel pattern 904 of FIG. 10, after binning only the primary colors results in the following pixel pattern:

$$1 = 2 \times G$$
$$2 = 2 \times R$$
$$3 = 2 \times B$$
$$4 = 2 \times G$$

FIGS. 11-20 illustrate further examples of exemplary arrangements of N×M patterns 102 incorporating aspects of the disclosed embodiments. In these examples, the N×M pattern 102 is a 4×4 pattern and comprises four 2×2 pixel groups 110, 120, 130 and 140. In the examples of FIGS. 11-18, the arrangements 1011-1020 illustrate an 8×8 pattern formed from the 4×4 pattern arrangements 11-20.

In the examples of FIGS. 11-18, in the first 2×2 pixel group 110, the first color is red, in the second 2×2 pixel group 120 the first color is blue, in the third 2×2 pixel group 130 the first color is green, and in the fourth 2×2 pixel group 140 the first color is green. As is shown in the examples of FIGS. 11-14, the arrangement of the 2×2 pixel groups in the 4×4 is such that the green color pixels of the pixel group 130 are aligned perpendicularly to the green color pixels of the pixel group 140. The red color pixels of the pixel group 110 are aligned in a same direction as the blue color pixels of the pixel group 120.

In the examples of FIGS. 15-18, the green color pixels of the pixel group 130 are aligned perpendicularly to the green color pixels of the pixel group 140 and the red color pixels of the pixel group 110 are aligned perpendicularly to the blue color pixels of the pixel group 120.

While the examples of FIGS. 11-18 show alternative examples of primary color arrangements for a color filter array 100 incorporating aspects of the disclosed embodiments, the aspects of the disclosed embodiments are not so limited. In alternate embodiments, other suitable primary color arrangements are contemplated. Examples of exemplary 4×4 groups are listed below, where each primary color letter represents one 2×2 pixel group of the 4×4 group:

| | |
|---|---|
| R | G |
| G | B |
| G | R |
| B | G |
| G | B |
| R | G |
| B | G |
| G | R |

Figure 19:
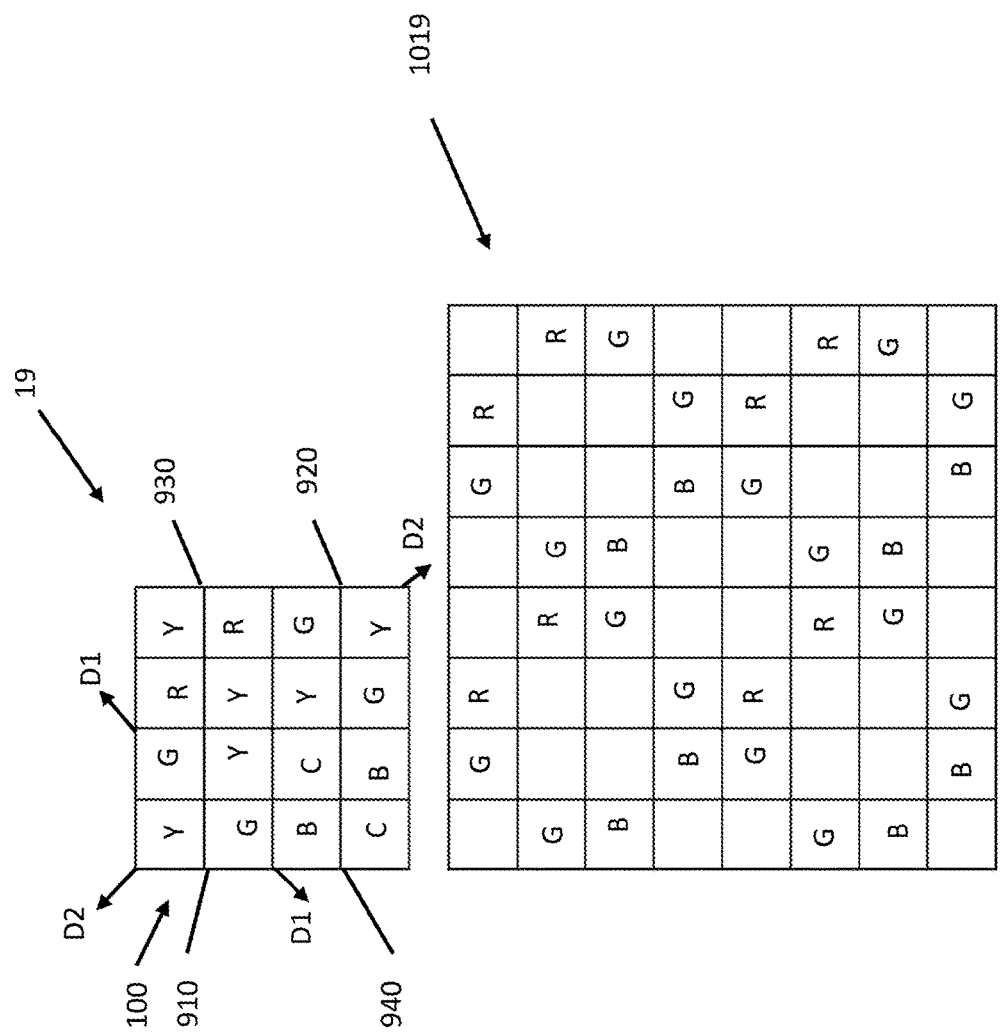
Figure 20:
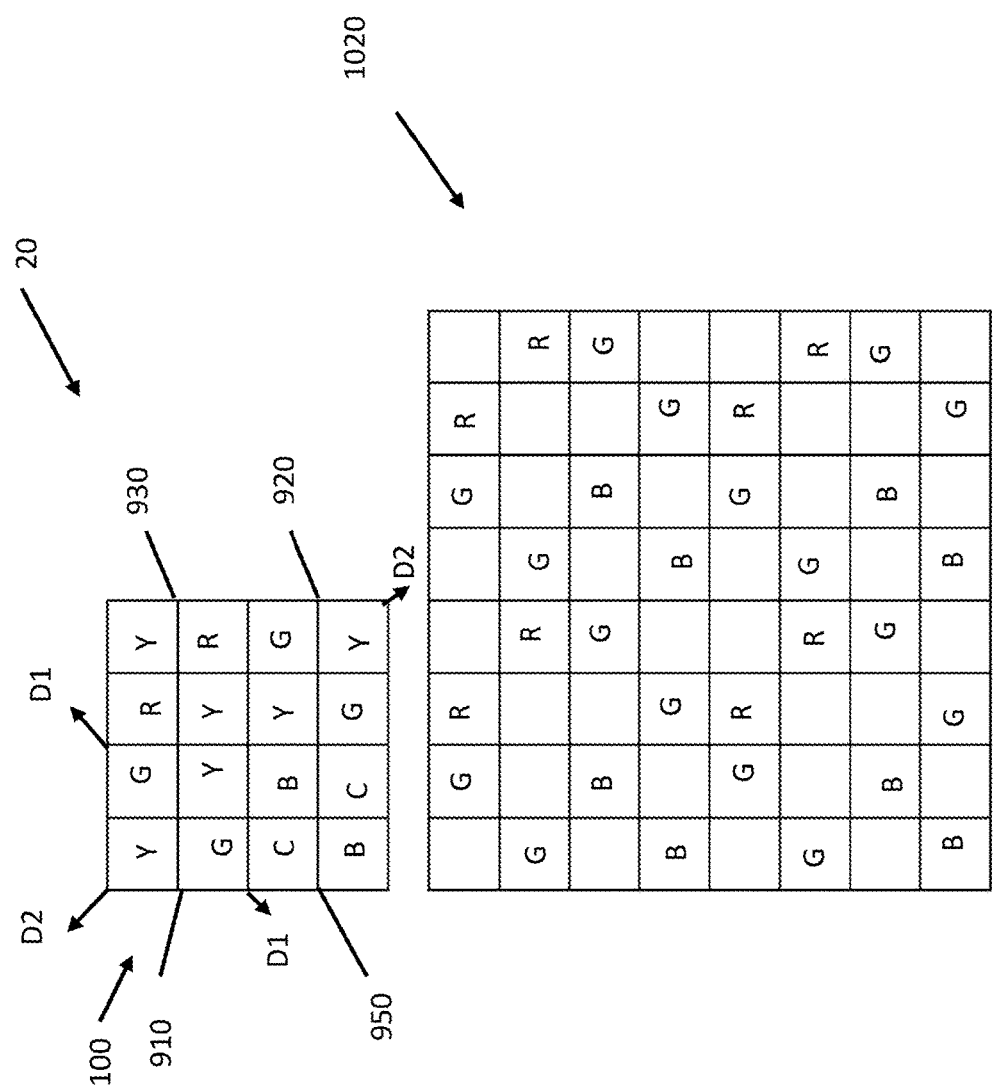

FIGS. 19 and 20 illustrate further exemplary color pattern arrangements 19 and 20, respectively, of a color filter apparatus 10 incorporating aspects of the disclosed embodiments. In the examples of FIGS. 19 and 20, the illustrated arrays 19 and 20 of the N × M pattern are 4×4 array patterns comprised of four 2×2 pixel groups 100. The arrays 1019 and 1020 illustrate an 8×8 pattern formed from the respective 4×4 pattern arrangements 19 and 20.

As is shown in the example of FIG. 19, the pixels G of the first color of pixel group 910 are disposed on the diagonal D1. In this example, there are two pixels G of the first color in the 2×2 pixel group 910. The two pixels G are aligned on the same diagonal, adjacent to one another. The first color is a primary color, such as red, green or blue.

The pixels Y of the second color of pixel group 910 are aligned on diagonal D2, which is disposed in a perpendicular relationship with respect to diagonal D1. There are two pixels Y is the 2×2 pixel group 910. The second color is a non-primary color such as yellow, cyan or white. Additionally, pixels G of the first color in pixel group 910 are disposed in a parallel relationship with respect to pixels G in pixel group 920.

In the example of FIG. 19, the pixel group 910 includes two pixels Y of the second color, the pixel group 920 includes two pixels Y of the second color and the pixel group 930 includes two pixels Y of the second color. As shown in FIG. 19, the pixels Y of the pixel group 910 and the pixels Y of the pixel group 920 are aligned along the same diagonal, which in this example is diagonal D2.

In one embodiment, as illustrated in FIG. 19, the pixels Y of the pixel group 930 are aligned perpendicularly to the pixels Y of the pixel group 920.

The plurality of 2×2 pixel groups 100 will include at least one 2×2 pixel group with a non-green first color and at least one 2×2 pixel group with a green first color. In one embodiment, non-green first colors of one 2×2 pixel group 100 are aligned in parallel with non-green first colors of another 2×2 pixel group 100. Green pixels of one of other 2×2 pixel groups 100 are aligned in parallel to green pixels of another one of the 2×2 pixel groups 100. In the example of FIG. 19, the pixel group 930 includes red pixels R and the pixel group 940 includes blue pixels B. The red pixels R of pixel group 930 are aligned in parallel with the blue pixels B of the pixel group 940.

In one embodiment, non-green first color pixels of one of the 2×2 pixel groups 100 are aligned perpendicularly to non-green first color pixels of another one of the 2×2 pixel groups. An example of this is illustrated in FIG. 20. In this example, pixel group 950 includes blue first color pixels B. The pixels B of pixel group 950 are disposed perpendicularly to pixels R of pixel group 930. In this example, the green first color pixels G of pixel group 910 are aligned in parallel with respect to green first color pixels G of pixel group 920.

The aspects of the disclosed embodiments are directed to a color filter array for an image sensor, such as a photosensor. The particular arrangement of color filters described herein can be implemented in single-chip digital image sensors, such as those used in digital cameras, camcorders, and scanners, for example to create a color image. The color filter array of the disclosed embodiments provides high quality in full resolution mode and is also compatible with Bayer pattern in a binning mode. According to the aspects of the disclosed embodiments, the pixels inside a 2×2 pixel group 110 are binned together. This is unlike other binning techniques such as the Bayer pattern where pixels are binned among the same colors in neighboring 2×2 pixel groups, i.e. same color binning, or the Quad Bayer pattern where same colored pixels are binned inside a 2×2 pixel group, i.e. 4 same colored pixels are binned into one pixel.

The N×M color pattern described herein can provide high quality in full resolution mode. Sharpness is improved over both Bayer and Quad Bayer by proper selection of colors and the arrangement of the pixels in the N×M pattern as disclosed herein. While certain colors are referenced with respect to the embodiments disclosed herein, the references are merely exemplary, and any suitable narrow spectrum or wide spectrum color can be implemented as described herein.

Thus, while there have been shown, described and pointed out, fundamental novel features of the invention as applied to the exemplary embodiments thereof, it will be understood that various omissions, substitutions and changes in the form and details of devices and methods illustrated, and in their operation, may be made by those skilled in the art without departing from the spirit and scope of the presently disclosed invention. Further, it is expressly intended that all combinations of those elements, which perform substantially the same function in substantially the same way to achieve the same results, are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A color filter apparatus, the color filter apparatus comprising:
   an image sensor; and
   a two-dimensional array of an N×M pattern of light sensitive elements, the N×M pattern comprising a plurality of 2×2 pixel groups, the plurality of 2×2 pixel groups comprising at least one 2×2 pixel group that comprises:
      a first color filter of a first color, the first color being a primary color, the primary color including at least one of red, green, or blue; and
      a second color filter of a second color, the second color comprising a green color and one other color that does not include a third primary color,
   wherein:
      either the first color is green, and the one other color is another primary color other than green; or
      the first color is not green, and the one other color is red or blue, wherein two pixels of the first color and two pixels of the second color of the at least one of the 2×2 pixel groups are configured to be combined into one pixel during binning, the binning implemented by the image sensor.

2. The color filter apparatus according to claim 1, wherein two diagonally aligned pixels of the at least one 2×2 pixel group are the primary color and two other diagonally aligned pixels of the at least one 2×2 pixel group are the second color.

3. The color filter apparatus according to claim 1, wherein non-green primary colors of one of the at least one 2×2 pixel group and non-green primary colors in another one of the at least one 2×2 pixel group are aligned in a same direction, or are aligned perpendicularly to each other.

4. The color filter apparatus according to claim 1, wherein green primary colors in one of the at least one 2×2 pixel group and green primary colors in another one of the at least one 2×2 pixel group are aligned in a same direction, or are aligned perpendicularly to each other.

5. The color filter apparatus according to claim 1, wherein non-green primary colors of one of the at least one 2×2 pixel group are aligned perpendicularly to non-green primary colors of another one of the at least one 2×2 pixel group and are aligned in a same direction with green primary colors of a further another one of the at least one 2×2 pixel group.

6. The color filter apparatus according to claim 1, wherein non-green primary colors of one of the at least one 2×2 pixel group are aligned perpendicularly to non-green primary colors of another one of the at least one 2×2 pixel group and green primary colors of the one of the at least one 2×2 pixel group are aligned perpendicularly to green primary colors of a further one of the at least one 2×2 pixel group.

7. The color filter apparatus according to claim 1, wherein one pixel of the at least one 2×2 pixel group is the primary color and another three pixels of the at least one 2×2 pixel group are another color.

8. The color filter apparatus according to claim 7, wherein a row and a column in the N×M pattern each include only one primary color,
   wherein there is at least one row and at least one column between each green color pixel in the N×M pattern,
   wherein a first non-green color pixel is disposed adjacent to and aligned diagonally with a green color pixel, and
   wherein another non-green color pixel is not disposed adjacent to or aligned diagonally with the green color pixel.

9. The color filter apparatus according to claim 1, wherein:
   the first color is green and the second color is yellow; or
   the first color is green and the second color is cyan; or
   the first color is red and the second color is yellow; or
   the first color is blue and the second color is cyan.

* * * * *